(12) United States Patent
Nishio et al.

(10) Patent No.: US 6,211,043 B1
(45) Date of Patent: Apr. 3, 2001

(54) METHOD OF MANUFACTURING A COMPOUND SEMICONDUCTOR THIN FILM ON A SUBSTRATE

(75) Inventors: Tsuyoshi Nishio, Mino; Kuniyoshi Omura; Takeshi Hibino, both of Ikoma; Satoshi Shibutani; Mikio Murozono, both of Hirakata, all of (JP)

(73) Assignee: Matsushita Battery Industrial Co., Ltd., Osaka (JP)

( * ) Notice: Subject to any disclaimer, the term of this patent is extended or adjusted under 35 U.S.C. 154(b) by 0 days.

(21) Appl. No.: 09/261,518

(22) Filed: Mar. 3, 1999

(51) Int. Cl.$^7$ .................................................. H01L 21/20
(52) U.S. Cl. ............................................................ 438/488
(58) Field of Search ................................ 438/48, 57, 85, 438/86, 93, 94, 95, 97, 104, 488, 761; 136/258, 260

(56) References Cited

U.S. PATENT DOCUMENTS

| 5,714,391 | 2/1998 | Omura et al. |
| 5,920,798 | * 7/1999 | Higuchi et al. ..................... 438/761 |

FOREIGN PATENT DOCUMENTS

| 53-138290 | 2/1978 | (JP) . |
| 61-166978 | 7/1986 | (JP) . |
| 61-166979 | 7/1986 | (JP) . |
| 62-146276 | 6/1987 | (JP) . |
| 08316247 | 11/1996 | (JP) . |
| 09074065 | 3/1997 | (JP) . |
| 10004206 | 1/1998 | (JP) . |

OTHER PUBLICATIONS

Gérard Blandenet, et al., "Thin Layers Deposited By The Pyrosol Process" Thin Solid Films, 77 (1981) pp. 81–90.

* cited by examiner

Primary Examiner—Charles Bowers
Assistant Examiner—Keith Christiansa
(74) Attorney, Agent, or Firm—Akin, Gump, Strauss, Hauer & Feld, L.L.P.

(57) ABSTRACT

The present invention relates to a method of manufacturing a compound semiconductor thin film by the thermal decomposition of a metal organic compound and a solar cell using the above thin film. An organic solvent solution of the metal organic compound containing at least one metal-sulfur bond is pulverized into fine particles by an ultrasonic vibration method or by a spray injection method and the obtained fine particles or gaseous metal organic compound are thermally decomposed by contacting them on the heated surface of a thin film forming substrate and thus a compound semiconductor metal sulfide thin film is formed on the thin film forming substrate. With this method, a compound semiconductor thin film of large surface area with uniform quality can be manufactured at low manufacturing cost with good reproducibility. These metal sulfide thin films are of high purity, high density and high quality and thus can be used for various photo-electronic devices.

8 Claims, 4 Drawing Sheets

METHOD OF MANUFACTURING A COMPOUND SEMICONDUCTOR THIN FILM ON A SUBSTRATE

BACKGROUND OF THE INVENTION

This invention relates to a method of manufacturing a compound semiconductor thin film of a metal sulfide for photoelectric devices or solar cells, and solar cells using the compound semiconductor thin film as an n-type semiconductor layer.

Compound semiconductor thin films consisting of metal sulfides, such as cadmium sulfide (CdS), zinc sulfide (ZnS), lead sulfide (PbS), copper sulfide (CuS), mercury sulfide (HgS) and so on, are extensively used for photoelectric device materials in the photoelectric device industry. For example, a CdS thin film has been used to construct a photo-conductive sensor and a photo-filter by utilizing the change of its electric resistance caused by the irradiation of light on an optical filter. Also, CdS/CdTe system compound semiconductor solar cells comprised of the thin films of CdS and CdTe have been commercialized.

Many of these compound semiconductor thin films are manufactured by a sputtering method or a vacuum evaporation method, in which source materials are evaporated under reduced pressure and thin films are formed on a substrate. By using any of these methods, the desired thin film properties for photoelectric device materials can be obtained. However, since these methods have to be conducted in a vacuum chamber, they are not suitable for a high-speed continuous deposition of thin films with large surface area and with uniform thickness. If the investment for enabling the large scale deposition of thin films by any these method were made, the amount for this large and complex equipment would be prohibitively high.

The chemical bath deposition method is a method with which compound semiconductor thin films of large surface area can be more inexpensively manufactured than by the above methods. For example, for manufacturing CdS thin film, a substrate is immersed in an aqueous solution containing both cadmium-containing compound such as cadmium acetate and sulfur-containing compound such as thiourea, and a CdS layer is deposited on the substrate. When the CdS layer is heat treated, it becomes dense and thus a CdS thin film is formed.

With this method, a CdS thin film of large surface area can be manufactured, but the obtained CdS thin film is not uniform and the process lacks in reproducibility since the CdS layer cannot be uniformly deposited.

As another method of depositing a thin film, Pyrosol process, based on the pyrolysis of an aerosol produced by ultrasonic spraying method, has been reported (Thin Solid Films. vol. 77. pp. 81–90(1981) ). This research is mainly directed to the deposition of metal oxides ($In_2O_3$, $Fe_2O_3$, $SnO_2$ etc.) on a glass substrate by the pyrolysis using a metal organic compound as a source material.

In this report, it is described that the deposition of other materials such as metal sulfides is also possible by the above-mentioned method. But, concerning the deposition of the metal sulfides such as CdS, it is only abstractly described that two (2) compounds, providing the metal and the sulfur respectively, are needed as source materials for such coating.

Furthermore, this method of the deposition of the metal sulfides is considered to have various disadvantages, such as that it is very difficult to select these two source materials having the same thermal decomposition temperature and that it is very difficult to control the concentration of the provided metal and sulfur at the constant ratio.

The printing and sintering method has been proposed with which compound semiconductor thin films of large surface area and with uniform thickness can be continuously manufactured by using inexpensive equipment with good reproducibility. In this method, a paste is prepared by dispersing fine particles of a compound semiconductor and then the paste is coated on a substrate in the form of a film by a screen printing method, dried and sintered in the furnace on a continuous moving belt.

With this method, it is also possible to perform patterning during thin film formation. Consequently, this method is now practically used for the manufacture of CdS/CdTe system compound semiconductor solar cells which are comprised of the sintered thin films of CdS and CdTe (Japanese Patent Publication No. Sho 56-28386).

In this case, a CdS thin film is manufactured by the following process. First, a paste is prepared by dispersing fine particles of CdS, added with cadmium chloride ($CdCl_2$) as a reducing agent of the melting point, in a dispersing solvent such as propylene glycol and then the paste is coated on a substrate, dried and sintered and thus the Cds thin film is manufactured. However, this method has the following disadvantages.

Since the required sintering temperature is as high as about 700° C., a conventional inexpensive soda lime glass plate cannot be used as a substrate, it is necessary to use a substrate having both a high heat resistance and chemical stability, such as a ceramic sheet of alumina of high purity or a barium borosilicate glass, both of which are known as very expensive materials. It is not suitable for high speed mass production, since the sintering period required is often more than two (2) hours.

Moreover, the sintering has to be performed in an inert gas atmosphere, such as in nitrogen gas, and by accommodating a dried substrate in an expensive ceramic case in order to suppress the quick evaporation of $CdCl_2$. Additionally, since a source material of CdS powder can only be pulverized into fine particles of 2 to 4 μm, it is not possible to manufacture a film of thinner than 2 to 4 μm, which is a diameter of pulverized CdS fine particles. Normally, CdS film as per manufactured by this method has a thickness of 20 to 60 μm. Its surface is often irregular and has a number of void spaces inside of the film. Consequently, it is not possible to obtain a thin film of uniform quality.

Since a compound semiconductor thin film which is manufactured by the printing and sintering method is relatively thick with a number of void spaces insides, it has a low light transmittance. Consequently, when this thin film is used as an n-type semiconductor layer of a solar cell, the solar cell cannot have an acceptable photoelectric conversion efficiency.

Recently, another method of manufacturing a compound semiconductor thin film of a metal sulfide is proposed in which a metal organic compound containing at least one metal-sulfur bond is thermally decomposed. This method is advantageous in that an inexpensive soda lime glass plate can be used as a thin film forming substrate since film forming temperature is lower than that required for the sintering in the printing and sintering method.

Example of the concrete method of manufacturing the thin film by using this method is as follows. First, the metal organic compound layer is formed on a substrate and then a thin film of a metal sulfide is formed on the substrate by thermally decomposing the metal organic compound in an inert gas atmosphere or in a mixed gas atmosphere of an inert gas and hydrogen sulfide(H$_2$S) (Japanese Laid-Open Patent Publication Nos. Sho 61-166979 and Sho 61-166978).

However, this method has various disadvantages such as the metal organic compound is not completely decomposed in the inert gas atmosphere and as a result, black organic ingredients containing carbon or carbon compound remain in the thin film as performed.

In order to solve the above problem, another concrete method is proposed with which a solution of the metal organic compound is coated on the substrate by, for example, spin coating method and a metal sulfide thin film is formed on the substrate by thermally decomposing the metal organic compound in oxygen containing atmosphere. (Japanese Laid-Open Patent Publication No. Sho 62-146276).

Another concrete method is proposed with which an organic solvent solution of the metal organic compound, the solution having a viscosity of a specified range, is coated on the substrate by a printing method, dried and a metal sulfide thin film is formed on the substrate by thermally decomposing the metal organic compound. (Japanese Laid-Open Patent Publication No. Hei 8-316247).

However, any of these two (2) concrete methods have various disadvantages, such as it is very difficult to uniformly coat a solution of the metal organic compound on the substrate of large surface area and thus it was not possible for a metal sulfide thin film with large surface area and with uniform thickness to be manufactured in an industrial scale.

In these two methods, it is aimed to manufacture a thin film of high purity with few residual ingredients by sufficiently oxidizing the metal organic compound during the thermal decomposition in oxygen containing atmosphere and thus removing all ingredients other than metal and sulfur by vaporization of the ingredients.

However, it was very difficult to manufacture a thin film of acceptable high purity since it is difficult to completely oxidize and thermally decompose the whole metal organic compound especially which is present in the proximity of the surface of the substrate among the coated layer of the organic solvent solution. It was often the case that some amount of impurities remained.

In addition to these methods, another concrete method of manufacturing a compound semiconductor thin film by thermal decomposition is proposed with which a paste containing the metal organic compound containing at least one metal-sulfur bond is coated on a source substrate and the metal organic compound is vaporized by heating the source substrate. Then, the gaseous metal organic compound is thermally decomposed by contacting the gaseous metal organic compound at the heated surface of a thin film forming substrate which is placed opposite to the proximity of the source substrate, and a metal sulfide thin film is formed on the thin film forming substrate. (Japanese Laid-Open Patent Publication Nos. Hei 9-74065 and Hei 10-4206 and U.S. Pat. No. 5,714,391).

However, this method has various disadvantages, such as manufacturing cost of the thin film is very expensive since the source substrate is necessary in addition to the thin film forming substrate and also a complicated coating process of the paste on the source substrate is necessary.

Moreover, it is difficult to uniformly contact the gaseous metal organic compound at the surface of the thin film forming substrate and to supply the center part of the surface of the thin film forming substrate with sufficient amount of oxygen. Consequently, it was difficult to manufacture the thin film with uniform thickness, high purity and large surface area by this method.

BRIEF SUMMARY OF THE INVENTION

An object of the present invention is to provide an industrial method of manufacturing a compound semiconductor thin film of a metal sulfide with large surface area, uniform quality, high density and high purity at low manufacturing cost with acceptable reproducibility.

Another object of the present invention is to provide a solar cell with both low manufacturing cost and high photoelectric conversion efficiency by constructing the solar cell by using the compound semiconductor thin film which is manufactured by the above-mentioned method.

A method of manufacturing a compound semiconductor thin film according to the present invention comprises the steps of pulverizing an organic solvent solution of a metal organic compound containing at least one metal-sulfur bond into fine particles, thermally decomposing the obtained fine particles by contacting them at the surface of a heated thin film forming substrate and thus forming a compound semiconductor thin film of a metal sulfide on the substrate.

Another method of manufacturing a compound semiconductor thin film according to the present invention comprises the steps of pulverizing an organic solvent solution of a metal organic compound containing at least one metal-sulfur bond into fine particles, vaporizing the organic solvent by heating the fine particles, vaporizing the metal organic compound into gaseous bodies by heating further, thermally decomposing the obtained gaseous metal organic compound by contacting the gaseous metal organic compound at the surface of a heated thin film forming substrate, and thus forming a compound semiconductor thin film of a metal sulfide on the substrate.

Solar cells according to the present invention are compound semiconductor solar cells by using a compound semiconductor metal sulfide thin film, the thin film being manufactured by the method of the present invention, as an n-type semiconductor layer.

While the novel features of the invention are set forth particularly in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1:
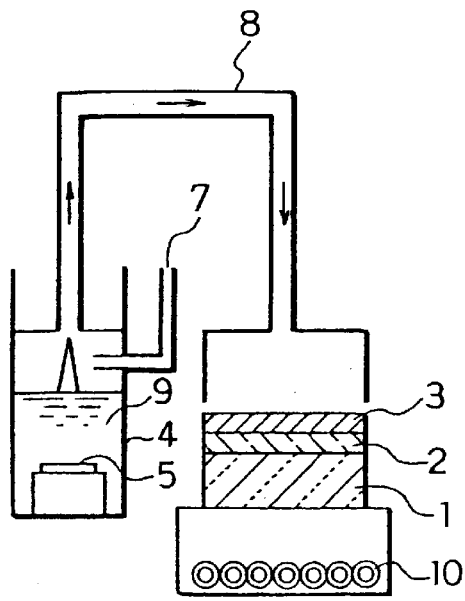
FIG. 1 is a schematic sectional view of an equipment example for manufacturing a compound semiconductor thin film according to the present invention.

The present invention makes the use of advantages of the method for manufacturing a metal sulfide thin film by thermal decomposition methods and solves above-mentioned various problems involved in the conventional methods.

In a method of manufacturing a compound semiconductor thin film according to the present invention, first an organic solvent solution of a metal organic compound containing at least one metal-sulfur bond is pulverized into fine particles and the obtained fine particles are contacted at the surface of a thin film forming substrate which is heated to the temperature higher than the thermal decomposition temperature of the metal organic compound.

In this way, the metal organic compound contained in the fine particles is thermally decomposed at the surface of the substrate or at its proximity, and thus a compound semiconductor metal sulfide thin film is formed on the surface of the substrate.

When the above-mentioned method of manufacturing according to the present invention is used, the organic solvent solution of the metal organic compound is uniformly contacted at the surface of the substrate in the form of fine particles, and thus the metal organic compound is thermally decomposed uniformly on the whole part of the surface.

As a result, a metal sulfide thin film of large surface area with uniform thickness can be formed. Since the metal organic compound is thermally decomposed in the form of fine particles, it is decomposed without remaining any ingredients which are not decomposed. In this way, a metal sulfide thin film of high density, high purity and high light transmittance is formed without containing any residual ingredients insides such as carbon. Moreover, since these thin films can be formed in the air by using an inexpensive equipment, a metal sulfide thin film at low manufacturing cost can be obtained.

In another method of manufacturing a compound semiconductor thin film according to the present invention, first an organic solvent solution of a metal organic compound containing at least one metal-sulfur bond is pulverized into fine particles and the obtained fine particles are heated to the temperature which is close to the boiling point of the organic solvent, and also which is not higher than the melting point or the sublimation point of the metal organic compound. In this way, only the organic solvent in the fine particles is vaporized and the metal organic compound is separated from the organic solvent solution.

Next the fine particles of the metal organic compound in a solid state are heated to the temperature of higher than the boiling point or the sublimation point of the metal organic compound but of below the thermal decomposition temperature and are vaporized into gaseous bodies via liquid state or by direct sublimation.

When the obtained gaseous metal organic compound is contacted at the surface of a thin film forming substrate which is heated to the temperature higher than the thermal decomposition temperature of the metal organic compound and the metal organic compound is thermally decomposed, a compound semiconductor metal sulfide film is formed on the surface of the substrate.

In this method, the gaseous metal organic compound, which means molecules of the metal organic compound, is contacted at the surface of the substrate. Consequently, the metal organic compound is thermally decomposed on the whole part of the surface more uniformly and more completely than in the above-mentioned first method. As a result, a compound semiconductor thin film of large surface area with more uniform thickness and higher purity than that formed in the first method is manufactured.

In addition, compared with the first method, in which the fine particles of the organic solvent solution of the metal organic compound are contacted at the surface of the substrate, the gaseous metal organic compound is contacted at the surface of the substrate in this method. Therefore, the temperature of the surface of the substrate little decreases by the contact.

Consequently, it is possible to control the temperature of thermal decomposition reaction of the metal organic compound more precisely than in the first method, and thus, in this method, a compound semiconductor thin film of high density and of high quality is manufactured, in which metal sulfide molecules are regularly arranged on the substrate.

The organic solvent solution of the metal organic compound is preferred to be pulverized into fine particles by an ultrasonic vibration method or by a spray injection method.

When the ultrasonic vibration method is used for pulverization into fine particles, it is easy to control the average diameter of fine particles by suitably adjusting the frequency of the ultrasonic vibration according to the properties of the organic solvent solution of the metal organic compound.

When the average diameter of the fine particles is controlled to be within a suitable range, it becomes possible to quickly vaporize both the organic solvent and the metal organic compound contained in the fine particles, before the fine particles reach the heated surface of the substrate.

Consequently, it becomes possible to thermally decomposes themetal organic compound more uniformly on the whole surface than when the average diameter is not suitably controlled. In this way, it becomes possible to form a compound semiconductor thin film with uniform and high quality. In order to achieve the above, it is preferred to control the average diameter of the fine particles of the metal organic compound to be in a range of 1 to 20 $\mu$m.

When the average diameter is below 1 $\mu$m, thermal decomposition reaction is liable to occur before the metal organic compound reaches the surface of the substrate. Consequently, it is difficult to form a metal sulfide thin film of acceptable quality on the substrate. When the average diameter is over 20 $\mu$m, the metal organic compound is not uniformly decomposed on the surface of the substrate. Consequently, it is difficult to form a metal sulfide thin film of uniform quality on the substrate.

The above mentioned average diameter (D) of the fine particles is expressed by the following formula:

$$D = \Sigma nd^3 / \Sigma nd^2$$

where n is a number of fine particles which are present in each range obtained by dividing the range between largest diameter and smallest diameter by a factor of 10, d is a median value of diameters in respective divided range.

Particle sizes of the obtained the fine particles can be measured by using a Laser method. In this method, particle sizes or particle size distribution can be measured from diffraction images which are formed by the interference of Laser lights which are scattered by the edges of fine particles which are present in the path of Laser lights.

The average diameter of the fine particles which are produced by the ultrasonic vibration mainly depends on the frequency of the ultrasonic vibration. However, it also depends on both the specific gravity and the surface tension of the organic solvent solution of the metal organic compound.

For example, in case of the toluene solution in which cadmium dibutyl dithiocarbamate is dissolved at the concentration of 17 to 20 wt % and with a viscosity of the solution being 0.85 to 0.95 centipoise (cP), it is possible to pulverize the toluene solution into the preferred range of 1 to 20 $\mu$m of the average diameter, when a frequency of the ultrasonic vibration is controlled to be in a range of 10 kHz to 3 MHz.

When the frequency of the ultrasonic vibration is over 3 MHz, the average diameter of fine particles becomes below 1 $\mu$m. When the frequency of the ultrasonic vibration is below 10 kHz, the average diameter of the fine particles becomes over 20 $\mu$m.

A spray injection method is another preferred method of pulverization into fine particles of the organic solvent solution of the metal organic compound. This method is advantageous in that the organic solvent solution can be pulverized into the fine particle by using inexpensive equipment.

In addition, it is possible to pulverize the organic solvent solution of the metal organic compound with higher concentration and with higher viscosity by this method than by the ultrasonic vibration method. Consequently, it is advantageous that a compound semiconductor thin film can be formed in higher speed by using this method than by using the ultrasonic vibration method.

When the organic solvent solution of the metal organic compound is pulverized into the fine particles by the spray injection method, it is also preferred to control the average diameter of the fine particles to be in a range of 1 to 20 $\mu$m by the same reasons as in case of the pulverization by the ultrasonic vibration method.

The metal organic compounds applicable to the present invention are these compounds containing at least one metal-sulfur bond, the metal being at least one metal selected from the group consisting of cadmium (Cd), zinc (Zn), copper (Cu), lead (Pb) and mercury (Hg).

The type of such metal organic compounds as applicable to the present invention can be metal mercaptide, metal thioate, metal dithioate, metal thiocarbonate, metal dithiocarbonate, metal trithiocarbonate, metal thiocarbamate, metal dithiocarbamate, and so on.

The metal organic compounds containing carbon and nitrogen, in addition to sulfur and metal, are preferably applicable to the present invention. When the metal organic compound contains both carbon and nitrogen, a metal sulfide thin film formed by the thermal decomposition of the metal organic compound especially strongly sticks to the surface of the substrate and also densely deposited on the surface. Consequently, a metal sulfide thin film with higher quality can be formed. More especially, when the metal thiocarbamate or metal dithiocarbamate is used, a metal sulfide thin film with very high quality can be formed.

Many of above-mentioned metal organic compounds are thermally decomposed below 500° C. and metal sulfides are produced. Consequently, in the present invention, a substrate material can be selected from wider variety of materials than in the conventional printing and sintering method. For example, these inexpensive materials with relatively low heat resistance, such as soda lime glass or low alkaline borosilicate glass, can be used as the substrate material.

When cadmium organic compounds are used out of the above-mentioned metal organic compounds, since they have the thermal decomposition temperature of 300 to 350° C., the surface temperature of the CdS thin film forming substrate is preferred to be kept in a range of 300 to 500° C.

When the surface temperature of the substrate is within the above range, the cadmium organic compound can be thermally decomposed in high efficiency. Consequently, it becomes possible to form a CdS thin film with high quality in a short period and with high yield rate.

When the surface temperature of the substrate is below 300° C., the cadmium organic compound is difficult to be thermally decomposed on the surface of the substrate. Consequently, a CdS thin film is difficult to be formed. When the surface temperature is over 500° C., the cadmium organic compound is thermally decomposed very rapidly. Consequently, it is difficult to form a CdS thin film with uniform and high quality.

Organic solvents for dissolving the metal organic compounds as applicable to the present invention can be the one selected from the group consisting of 1-methyl-2-pyrrolidone, xylene, toluene, γ-butyrolactone, tetralin, dimethyl formamide, dimethyl sulfoxide, chloroform, and alcohols, such as methyl alcohol, ethyl alcohol and multivalent alcohols.

The mixed solvent consisting of more than two (2) kinds of the above solvents can also be used. For example, a mixed solvent of 1-methyl-2-pyrrolidone and methyl alcohol at the mol ratio of 8:2 can be used as a solvent for dissolving cadmium dibenzyl dithiocarbamate. A mixed solvent of 1-methyl-2-pyrrolidone and butyl alcohol at the mol ratio of 6:4 can be used as a solvent for dissolving cadmium thiobenzoate.

When these organic solvents are used, the above metal organic compounds can be dissolved in the solutions in a high concentration, and therefore a compound semiconductor thin film can be formed at high speed.

Moreover, since the metal sulfide thin film which is manufactured using the method of the present invention has high quality and high light transmittance, the solar cells which are constructed by using the above metal sulfide thin film as an n-type semiconductor layer show high photoelectric conversion efficiency.

An example of the solar cell according to the present invention can be constructed as follows;

A transparent conductive film consisting of such metal oxide as tin oxide ($SnO_2$), indium-tin oxide (ITO) or zinc oxide is formed on one side surface of the transparent substrate such as glass plate. A compound semiconductor metal sulfide thin film is formed on the transparent conductive film by the method of the present invention, as an n-type semiconductor layer. Then, on the n-type semiconductor layer, a cadmium telluride (CdTe) thin film is formed as a p-type semiconductor layer, and thus a p-n junction is constructed.

After that, a current collector is formed on the p-type semiconductor film, and a positive electrode is formed which is electrically connected with the current collector. Finally, a negative electrode which is electrically connected with the n-type semiconductor layer is formed. In this way, a compound semiconductor solar cell can be constructed.

Another example of the solar cell according to the present invention can be constructed as follows;

A positive electrode is formed on a substrate which has both electric conductivity and heat resistance, and a CdTe or copper-indium-selenide (Cu—In—Se, CIS) thin film is formed on the positive electrode as a p-type semiconductor layer. Then, a compound semiconductor metal sulfide thin film is formed on the p-type semiconductor layer by the method of present invention, as an n-type semiconductor layer, and thus a p-n junction is constructed. Finally, a negative electrode is formed which is electrically connected with the n-type semiconductor layer. In this way, a compound semiconductor solar cell can be constructed.

In this case, the substrates which have both electric conductivity and heat resistance include a copper plate, or a sheet of copper, iron, stainless steel, aluminum or an insulating sheet which are plated with copper, silver, platinum, palladium or molybdenum on one side surface of the sheets.

Details of the equipment for manufacturing a compound semiconductor thin film according to the present invention are described below by referring to the attached drawings of FIG. 1, FIG. 2 and FIG. 3.

FIG. 1 shows an example of the equipment for manufacturing a compound semiconductor thin film according to the present invention.

A transparent conductive film 2 is formed on one side surface of a substrate 1 which has high heat resistance. The substrate 1 is placed on a heater 10 and it is heated to the temperature at which a metal organic compound is thermally decomposed. A compound semiconductor thin film 3 is formed on the transparent conductive film 2.

A vessel 4 is placed at a separate place from the substrate 1, and it is filled with an organic solvent solution 9 of the metal organic compound. A tube which is stretched from a carrier gas inlet 7 is connected to the upper empty space of the vessel 4. An ultrasonic vibration device 5 is placed at the bottom of the vessel 4. The vessel 4 and the substrate 1 are connected together by a tube 8. The end portion of the tube 8 of the substrate side is enlarged to the width which can just cover the substrate 1.

When the ultrasonic vibration device 5 is vibrated, the organic solvent solution 9 of the metal organic compound is pulverized into fine particles and upper empty space of the vessel 4 is filled with the fine particles. These fine particles are transported through the tube 8 by a carrier gas which is introduced from the carrier gas inlet 7 to the surface of the substrate 1, where they are injected. Then, the metal organic compound is thermally decomposed on the surface of the substrate 1 or at its proximity, and the compound semiconductor thin film 3 is formed on the transparent conductive film 2, which is formed in advance on the substrate 1.

Figure 2:
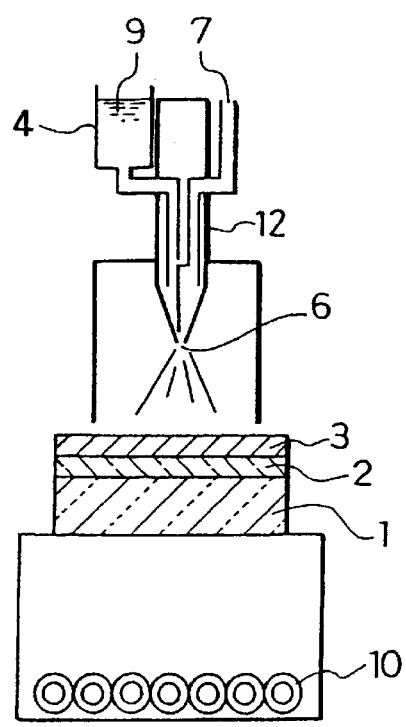
FIG. 2 is a schematic sectional view of another equipment example for manufacturing a compound semiconductor thin film according to the present invention.

FIG. 2 shows another example of the equipment for manufacturing a compound semiconductor thin film according to the present invention.

A transparent conductive film 2 is formed on one side surface of a substrate 1 which has high heat resistance. The substrate 1 is placed on a heater 10 and it is heated to the temperature at which a metal organic compound is thermally decomposed. Facing to the substrate 1, a nozzle 12 is placed, whose bottom part is provided with an injection outlet 6 of an organic solvent solution 9 of the metal organic compound. The nozzle 12 is also connected with a first tube which is stretched from a vessel 4 filled with the organic solvent solution 9 of the metal organic compound and with a second tube which is stretched from a carrier gas inlet 7.

When a carrier gas is supplied from the carrier gas inlet 7 to the injection outlet 6, the organic solvent solution 9 of the metal organic compound in the vessel 4 is injected in the form of fine particles from the injection outlet 6. Then, injected fine particles contact at the surface of heated substrate 1 and are thermally decomposed on the surface of substrate 1 or at its proximity. In this way, produced metal sulfides deposit on the transparent conductive film 2 and a compound semiconductor thin film 3 is formed.

Figure 3:
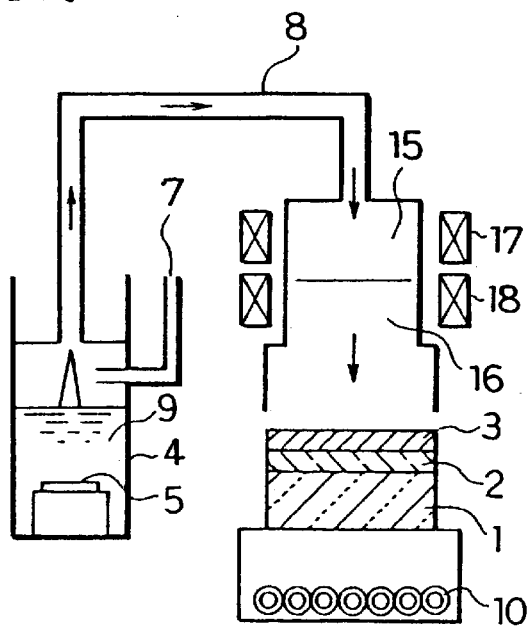
FIG. 3 is a schematic sectional view of other equipment example for manufacturing a compound semiconductor thin film according to the present invention.

FIG. 3 shows other example of the equipment for manufacturing a compound semiconductor thin film according to the present invention.

A transparent conductive film 2 is formed on one side surface of a substrate 1 which has high heat resistance. The substrate 1 is placed on the heater 10 and it is heated to the temperature at which a metal organic compound is thermally decomposed. A compound semiconductor thin film 3 is formed on the transparent conductive film 2.

A vessel 4 is placed at a separate place from the substrate 1, and it is filled with an organic solvent solution 9 of the metal organic compound. A tube which is stretched from a carrier gas inlet 7 is connected to the upper empty space of the vessel 4. An ultrasonic vibration device 5 is placed at the bottom of the vessel 4. The vessel 4 and the substrate 1 are connected together by a tube 8. The end portion of the tube 8 of the substrate side is enlarged to the width which can just cover the substrate 1.

In this enlarged portion, both a first heating zone 15, where the organic solvent is vaporized, and a second heating zone 16, where the metal organic compound is vaporized into gaseous bodies, are provided. Around the tube of the first heating zone 15, a heater 17 is provided which heats up the first heating zone 15. With this heater 17, a temperature of heating zone 15 is controlled to the temperature at which the organic solvent is vaporized. Around the tube of the second heating zone 16, a heater 18 is provided which heats up the second heating zone 16. With this heater 18, a temperature of the second heating zone 16 is controlled to the temperature at which the metal organic compound is vaporized into gaseous bodies.

When the ultrasonic vibration device 5 is vibrated, the organic solvent solution 9 of the metal organic compound is pulverized into fine particles and upper empty space of the vessel 4 is filled with the fine particles. These fine particles are transported through a tube 8 by a carrier gas, which is introduced from the carrier gas inlet 7, to the first heating zone 15. At this first heating zone 15, mainly the organic solvent is vaporized and separated from the metal organic compound.

When solid state fine particles of the metal organic compound reach the second heating zone 16, they are vaporized at this second heating zone. Then, the gaseous fine particles are injected on the surface of the substrate 1 which is heated up in advance and the metal organic compound is thermally decomposed on the surface of the substrate 1 or at its proximity. In this way, the compound semiconductor thin film 3 is formed on the transparent conductive thin film 2 which is formed in advance on the substrate 1.

A temperature of the first heating zone 15 is preferred to be controlled to that which is close to the boiling point of the organic solvent used, and also which is not higher than the sublimation point or the melting point of the metal organic compound used.

A temperature of the second heating zone 16 is preferred to be controlled to that which is close to the sublimation point or the boiling point of the metal organic compound used.

When the temperatures of both the first heating zone 15 and the second heating zone 16 are controlled to the higher temperature than the thermal decomposition temperature of the metal organic compound used, the metal organic compound thermally decomposes before it reach the surface of the substrate 1. Consequently, it is not possible to effectively form the compound semiconductor thin film 3 on the transparent conductive film 2.

In any of the above methods, the thermal decomposition reaction of the metal organic compound is preferred to be performed in oxygen containing atmosphere. Consequently, in addition to the air, a mixed gas of oxygen with inert gases such as nitrogen, argon, helium, and neon can be used. When the reaction furnace is filled with the air in advance only the inert gases can be used as the carrier gas.

And in any case of the above methods, a variety of insulating or conductive substrate which has high heat resistance can arbitrarily be used as the thin film forming substrate, other than a conductive substrate which is prepared by forming a transparent conductive film on a insulating plate such as glass plate.

The more details of the present invention are described below by referring to actual examples of the methods of manufacturing compound semiconductor thin films and the solar cells constructed by using the thin films manufactured by the above methods.

EXAMPLE 1

A compound semiconductor CdS thin film was formed by using the equipment which is shown in FIG. 1. A transparent conductive $SnO_2$ film 2 was formed on one side surface of a substrate 1 consisting of a soda glass plate of 35×35 cm² and used this as a thin film forming substrate. Cadmium dibenzyl dithiocarbamate was dissolved in 1-methyl-2-pyrrolidone at the concentration of 2.0 mol/l. This solution was used as the organic solvent solution 9 of the metal organic compound. The viscosity of the solution 9 was about 50 cP.

The solution 9 was poured in the vessel 4 and was pulverized into fine particles with average particle diameter of 6 µm, by using the ultrasonic vibration with a frequency of 2 MHz. Since the thermal decomposition temperature of cadmium dibenzyl dithiocarbamate is about 340° C., the temperature of the surface of the substrate 1 was controlled to be at 400° C. Air was used as the carrier gas and the compound semiconductor CdS thin film 3 was formed on the transparent conductive film 2. Necessary time period for forming the CdS thin film 3 was 210 sec.

The obtained CdS thin film was analyzed by X ray photo-electronic spectroscopy method. When the amount of residual carbon inside the thin film, which often causes a reduction of light transmittance, was measured on the obtained thin film, only a trace (below 1 atom %) was found and thus the obtained thin film was proved to be of high purity.

Figure 4:
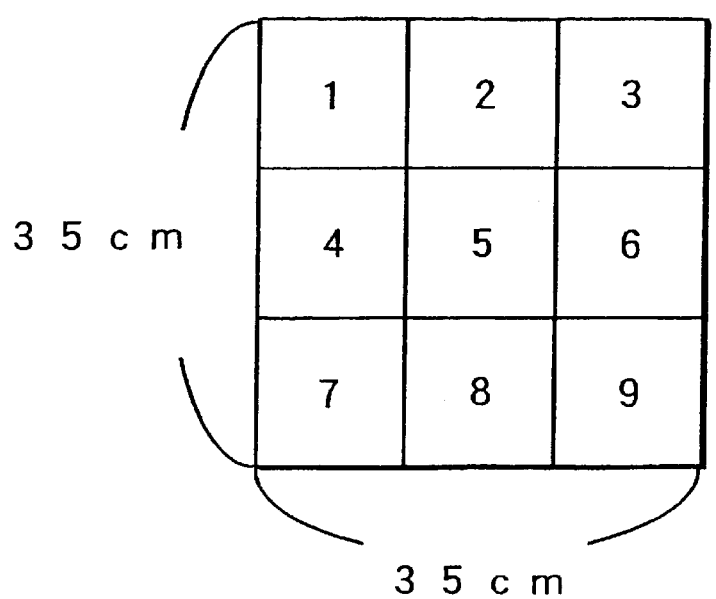
FIG. 4 is a plan view of a CdS thin film which is manufactured as an example of the present invention and divided into nine (9) equal portions for evaluation.

The obtained CdS film was divided into nine (9) equal portions as shown in FIG. 4 and a film thickness in each portion was measured. Results are shown in Table 1.

TABLE 1

| Portion No. | Thickness of thin film ($\uparrow$) |
| --- | --- |
| 1 | 500 |
| 2 | 520 |
| 3 | 540 |
| 4 | 510 |
| 5 | 520 |
| 6 | 540 |
| 7 | 510 |
| 8 | 520 |
| 9 | 530 |

As shown in Table 1, the thickness of the obtained CdS thin film controlled to be in a small range of 500 to 540 anstrom.

EXAMPLE 2

A compound semiconductor CdS thin film was formed by using the equipment which is shown in FIG. 3. The substrate 1 and the conductive film 2 was prepared in the same way as in Example 1. Cadmium dibenzil dithiocarbamate was dissolved in xylene at the concentration of 2.0 mol/l. This solution was used as the organic solvent solution 9 of the metal organic compound. The viscosity of the solution 9 was about 50 cP.

The solution 9 was poured in the vessel 4 and was pulverized into the fine particles with average particle diameter of 6 µm by using an ultrasonic vibration with a frequency of 2 MHz. The temperature of first heating zone 15 was controlled to be about 150° C., the temperature of second heating zone was controlled to be about 300° C. and the temperature of the surface of the substrate 1 was controlled to be 400° C.

In this condition, a compound semiconductor CdS thin film 3 was formed on the transparent conductive film 2 by using air as the carrier gas. The above respective temperatures were chosen based on the facts that the boiling point of xylene is 138° C., the melting point, the boiling point, and the thermal decomposition temperature of cadmium dibenzyl dithiocarbamate are 195° C., about 300° C. and about 350° C. respectively. Necessary time period for forming the CdS thin film was 180 sec.

When the amount of residual carbon inside the film was measured on the obtained thin film in the same way as used in Example 1, it was not detected at all. Consequently, the obtained thin film was proved to be of higher purity than the one obtained in Example 1.

The obtained CdS thin film was divided into nine (9) equal portions as shown in FIG. 4 and a film thickness in each portion was measured. Results are shown in Table 2.

TABLE 2

| portion No. | Thickness of thin film ($\uparrow$) |
| --- | --- |
| 1 | 510 |
| 2 | 520 |
| 3 | 510 |
| 4 | 510 |
| 5 | 510 |
| 6 | 510 |
| 7 | 520 |
| 8 | 500 |
| 9 | 510 |

As shown in Table 2, the thickness of the obtained CdS thin film was controlled to be in a small range of 500 to 520 angstrom. It means that the thickness of the obtained CdS thin film was controlled to be in a narrower range than that obtained in Example 1.

COMPARATIVE EXAMPLE 1

A Cds thin film was formed on the same thin film forming substrate as used in Example 1 by using conventional vacuum evaporation method. A pellet was prepared by molding CdS powder of high purity and used as a target. The distance between the target and the substrate was adjusted to be 100 mm and the Cds thin film was formed at the condition of $10^{-6}$ Torr and 350° C.

The obtained CdS thin film was divided into nine (9) equal portions as shown in FIG. 4 and a film thickness in each portion was measured. Results are shown in Table 3.

TABLE 3

| Portion No. | Thickness of thin film ($\uparrow$) |
| --- | --- |
| 1 | 500 |
| 2 | 550 |
| 3 | 550 |
| 4 | 580 |
| 5 | 600 |
| 6 | 520 |

TABLE 3-continued

| Portion No. | Thickness of thin film (↑) |
|---|---|
| 7 | 510 |
| 8 | 550 |
| 9 | 510 |

As shown in Table 3, the thickness of the obtained CdS thin film widely dispersed in a range of 500–600 angstrom. It means that the Cds thin films which are obtained in Example 1 and Example 2 have more uniform film thickness than that obtained in Comparative Example 1.

COMPARATIVE EXAMPLE 2

A Cds thin film was formed on the same thin film forming substrate as used in Example 1 by using a conventional thermal decomposition method of the metal organic compound. In this method, an organic solvent solution of the metal organic compound is coated on the substrate, dried and then thermally decomposed to form the CdS thin film on the $SnO_2$ transparent conductive film.

Cadmium dibenzyl thiocarbamate was dissolved in 1-methyl-2-pyrrolidone at the concentration of 0.4 mol/l. The viscosity of this solution was about 10 cP. The solution was coated by roll-coater on the $SnO_2$ film which was formed on the substrate. Then, it was dried at 150° C. and thermally decomposed for 120 sec. at 450° C. in air. In this way, the CdS thin film was formed on the $SnO_2$ film.

When the amount of residual carbon inside the film was measured on the obtained CdS thin film in the same way as used in Example 1, it was found to be 6 to 9 atom %. It means that higher amount of impurities are contained in this thin film than in the thin films obtained in Example 1 and Example 2, respectively.

The obtained CdS thin film was divided into nine (9) equal portions as shown in FIG. 4 and a film thickness in each portion was measured. Results are shown in Table 4.

TABLE 4

| Portion No. | Thickness of thin film (↑) |
|---|---|
| 1 | 500 |
| 2 | 540 |
| 3 | 500 |
| 4 | 580 |
| 5 | 570 |
| 6 | 580 |
| 7 | 510 |
| 8 | 550 |
| 9 | 520 |

As shown in Table 4, the thickness of the obtained CdS thin film widely dispersed in a range of 500 to 580 angstrom. It means that the Cds thin films which are obtained in Example 1 and Example 2 have more uniform film thickness than that obtained in Comparative Example 2.

EXAMPLE 3

Cds thin films were formed in the same way as in Example 1, using various cadmium organic compounds which are shown in Table 5. When the obtained CdS thin films were analyzed by X ray photo-electronic spectroscopy, it was found that the condition of cadmium-sulfur bond in the thin films was the same as the condition of cadmium-sulfur bond in a single crystal of CdS.

When the obtained CdS thin films were analyzed by X ray diffraction method, reflection peaks which are ascribed to (002) face were observed, and thus the obtained CdS thin films were identified to be constructed from hexagonal CdS crystals.

Furthermore, when Cd organic compounds which contain carbon and nitrogen, such as Cd diethyl dithiocarbamate, Cd dibutyl dithiocarbamate, Cd dibenzyl dithiocarbamate, and Cd thiocarbamate, were used as the source material, the peaks of (002) face of the obtained CdS thin films were sharper and their half-width were smaller than that of the other obtained CdS thin films. It proves that the above CdS thin films obtained from the Cd organic compounds containing carbon and nitrogen are especially highly crystallized and very dense.

Transmission spectrum of the obtained CdS thin films was measured by spectrophotometer, and the optical band-gaps as shown in Table 5 were obtained.

TABLE 5

| Type of Cd organic compound | Temp. of substrate (° C.) | Optical band-gap (eV) |
|---|---|---|
| Cadmium diethyl dithiocarbamate | 400 | 2.42 |
| Cadmium dibutyl dithiocarbamate | 400 | 2.40 |
| Cadmium dibenzyl dithiocarbamate | 400 | 2.44 |
| Cadmium thiocarbamate | 400 | 2.44 |
| Cadmium thioate | 400 | 2.43 |
| Cadmium dithioate | 400 | 2.44 |
| Cadmium thiocarbonate | 400 | 2.44 |
| Cadmium dithiocarbonate | 400 | 2.43 |
| Cadmium trithiocarbonate | 400 | 2.42 |
| Cadmium mercaptide | 400 | 2.44 |

As shown in Table 5, optical band-gaps of the obtained CdS thin films were in a range of 2.40 to 2.44 eV. These values are nearly the same value as 2.42 eV, which is a standard value of CdS single crystal. It proves that the obtained CdS thin films were films of high quality with few lattice defects.

EXAMPLE 4

CdS thin films were formed in the same way as in Example 2, by using various cadmium organic compounds which are shown in Table 6. When the obtained CdS thin films were analyzed by X ray photo-electronic spectroscopy, it was found that the condition of cadmium-sulfur bond in the thin films was the same as the condition of cadmium-sulfur bond in a single crystal of CdS.

When the obtained CdS thin films were analyzed by X ray diffraction method, reflection peaks which are ascribed to (002) face were observed, and thus the obtained CdS thin films were identified to be constructed from hexagonal CdS crystals.

Furthermore, when Cd organic compounds which contain carbon and nitrogen, such as Cd diethyl dithiocarbamate, Cd dibutyl dithiocarbamate, Cd dibenzyl dithiocarbamate, and Cd thiocarbamate, were used as the source material, the peaks of (002) face of the obtained CdS thin films were sharper and their half-width were smaller than that of the other obtained CdS thin films. It proves that the above CdS thin films obtained from the Cd organic compounds containing carbon and nitrogen are especially highly crystallized and very dense.

The optical band-gaps of the obtained CdS thin films were measured in the same way as in Example 3. Results are shown in Table 6.

TABLE 6

| Type of Cd organic Compound | Temp. of substrate (° C.) | Optical Band-gap (eV) |
| --- | --- | --- |
| Cadmium diethyl dithiocarbamate | 400 | 2.42 |
| Cadmium dibutyl dithiocarbamate | 400 | 2.40 |
| Cadmium dibenzyl dithiocarbamate | 400 | 2.44 |
| Cadmium thiocarbamate | 400 | 2.44 |
| Cadmium mercaptide | 400 | 2.44 |
| Cadmium thioate | 400 | 2.43 |
| Cadmium dithioate | 400 | 2.44 |
| Cadmium thiocarbonate | 400 | 2.44 |
| Cadmium dithiocarbonate | 400 | 2.43 |
| Cadmium trithiocarbonate | 400 | 2.42 |
| Cadmium isopropyl xanthogenate | 400 | 2.40 |
| Cadmium thiobenzoate | 400 | 2.43 |

As shown in Table 6, optical band-gaps of the obtained CdS thin films were in a range of 2.40 to 2.44 eV. These values are nearly the same value as a standard value of CdS. It proves that the obtained CdS thin films were films of high quality with few lattice defects.

EXAMPLE 5

A CdS thin film 3 was formed by using the equipment which is shown in FIG. 2. The substrate 1 and the transparent conductive $SnO_2$ film 2 were prepared in the same way as in Example 1. Cadmium thiobenzoate was dissolved in 1-methyl-2-pyrrolidone at the concentration of 0.5 mol/l. This solution was used as the organic solvent solution 9 of the metal organic compound. The viscosity of the solution 9 was about 50 cP.

The solution 9 was poured in the vessel 4 in FIG. 2. Air was provided from the carrier gas inlet 7 and the fine particles of the solution 9 were injected from the injection outlet 6 of the nozzle 12 on the surface of the substrate 1 which was heated at 400° C. The CdS thin film 3 was thus formed on the $SnO_2$ film 2.

When the obtained CdS thin film was analyzed in the same way as in Example 3, it was found that the condition of cadmium-sulfur bond in the CdS thin film was the same as that in CdS single crystal and that the CdS thin film was constructed from hexagonal CdS crystals. Consequently, the CdS thin film was identified to be a film of high quality with few lattice defects.

EXAMPLE 6

Compound semiconductor thin films consisting of various kinds of metal sulfides were formed in the same way as in Example 1, by using various kinds of metal organic compounds other than that of cadmium, as shown in Table 7.

The temperature of the surface of the thin film forming substrate was properly adjusted according to the thermal decomposition temperature of the metal organic compound. Optical band-gaps of the obtained metal sulfide thin films were measured in the same way as in Example 3. Results are shown in Table 7.

TABLE 7

| Type of metal organic compound | Produced sulfide | Temp. of substrate (° C.) | Optical band-gap (eV) |
| --- | --- | --- | --- |
| Copper diethyl dithiocarbamate | CuS | 380 | 1.40 |
| Zinc diethyl dithiocarbamate | ZnS | 500 | 3.60 |
| Mercury diethyl dithiocarbamate | HgS | 330 | 1.80 |
| Lead diethyl dithiocarbamate | PbS | 550 | 0.38 |

As shown in Table 7, optical band-gaps which were measured on the obtained metal sulfide thin films were nearly the same as the standard values of respective metal sulfides. It proves that all obtained metal sulfide thin films are of high quality with few lattice defects.

EXAMPLE 7

Figure 5:
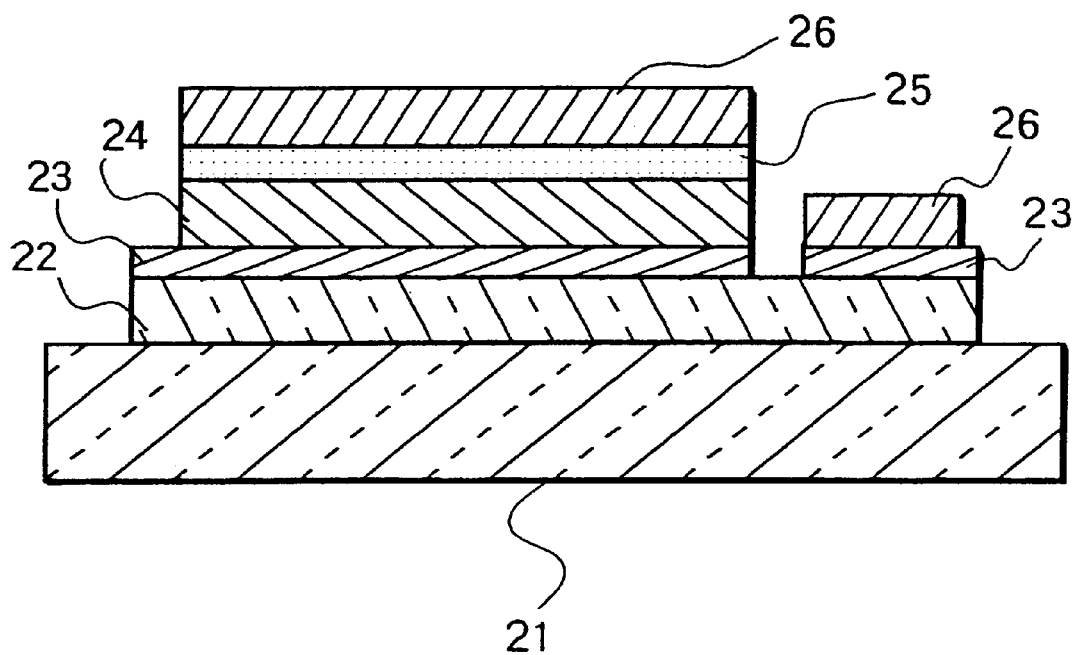
FIG. 5 is a sectional view of a solar cell of CdS/Cd/Te system which is constructed by using CdS thin film manufactured according to the method of the present invention.

CdS thin films were formed in the same way as in Example 1 and Example 2, and solar cells were constructed by using the CdS thin films respectively, as an n-type semiconductor layer. FIG. 5 is a sectional view of the solar cell.

A transparent conductive thin film 22 was formed on one side surface of the glass plate 21 and a CdS thin film 23 of 500 angstrom thick was formed on the transparent conductive film 22 in the same way as in Example 1 or Example 2. This CdS thin film was used as a window layer and a CdTe thin film 24 of 5 μm thick was formed on the CdS thin film 23 by using a proximity sublimation method. Then, a carbon electrode 25 was formed on the CdTe thin film 24. Finally, an Ag—In electrode 26 was formed on the CdS thin film 23 and on the carbon electrode 25 respectively, and thus the solar cell was constructed.

IV characteristics of respective solar cells as per constructed were measured by using a solar simulator light of AM 1.5, 100 $mV/cm^2$ at 25° C. In case of the solar cell which was constructed by using the CdS thin film formed in the same way as in Example 1, open circuit voltage was 820 mV, short circuit current density was 24.6 $mA/cm^2$, maximum output power density was 14.6 $mW/cm^2$, and photoelectric conversion efficiency was 14.6%.

In case of the solar cell which was constructed by using the CdS thin film formed in the same way as in Example 2, open circuit voltage was 830 mV, short circuit current density was 24.7 $mA/cm^2$, maximum output power density was 14.8 $mW/Cm^2$ and photoelectric conversion efficiency was 14.8%.

These values are much higher than those of conventional solar cells. The reason why such excellent characteristics were obtained for these above solar cells seems to be as follows;

First, photosensitivity at short wave length has increased since the obtained CdS thin film is very thin and dense without any void spaces.

Second, short circuit current has increased since the obtained CdS thin film is of high purity, with little amount of residual ingredients such as carbon and thus the light transmittance is high in the whole wave length.

COMPARATIVE EXAMPLE 3

Figure 6:
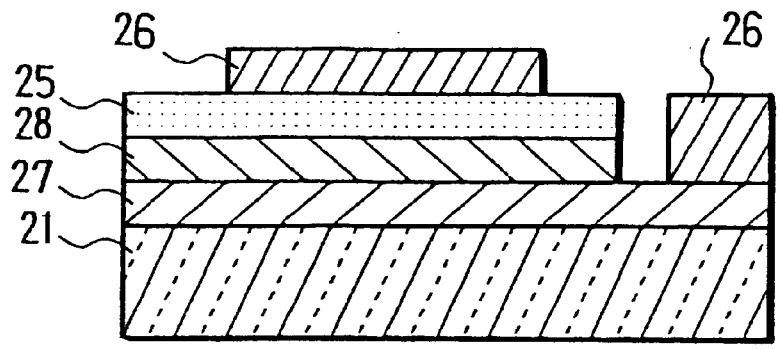
FIG. 6 is a sectional view of a solar cell of CdS/CdTe system which is constructed by using CdS film manufactured according to the printing and sintering method. This is shown as an comparative example.

A CdS thin film was formed by the conventional printing and sintering method, and a solar cell was constructed by using CdS film as an n-type semiconductor layer. FIG. 6 is a sectional view of the solar cell. The CdS sintered film 27 of about 20 μm thick was formed on the barium borosilicate glass plate 21 by the conventional screen printing and sintering method. A CdTe sintered film 28 was formed on the CdS sintered film 27. A carbon electrode 25 was formed on the CdTe sintered film 28. Then, an Ag—In electrode 26 was formed and thus the solar cell is constructed.

IV characteristics of the solar cell as per constructed were measured in the same way as in Example 7. Results were as follows; Open circuit voltage was 750 mV, short circuit current density was 22.5 mA/cm$^2$, maximum output power density was 11.3 mW/cm$^2$, and photoelectric conversion efficiency was 11.3%.

These values are much lower than those of the solar cells in Example 7. The reason why such inferior characteristics were obtained for the above solar cell seems to be mainly because the CdS sintered film 27 was as thick as about 20 μm since the film was formed by the conventional printing and sintering method.

COMPARATIVE EXAMPLE 4

A CdS thin film was formed in the same way as Comparative Example 2 by using a conventional thermal decomposition method of the metal organic compound. A solar cell was constructed by using the CdS thin film and in the same way as in Example 7.

IV characteristics of the solar cell as per constructed were measured in the same way as in Example 7. Results were as follows; Open circuit voltage was 810 mV, short circuit current density was 24.0 mA/cm$^2$, maximum output power density was 13.9 mW/cm$^2$ and photoelectric conversion efficiency was 13.9%. These values are lower than those of the solar cells in Example 7.

The reason why such inferior characteristics were obtained for the above solar cell seems to be because the CdS thin film is not of high density and of high purity compared with the CdS thin films in Example 7.

EXAMPLE 8

Figure 7:
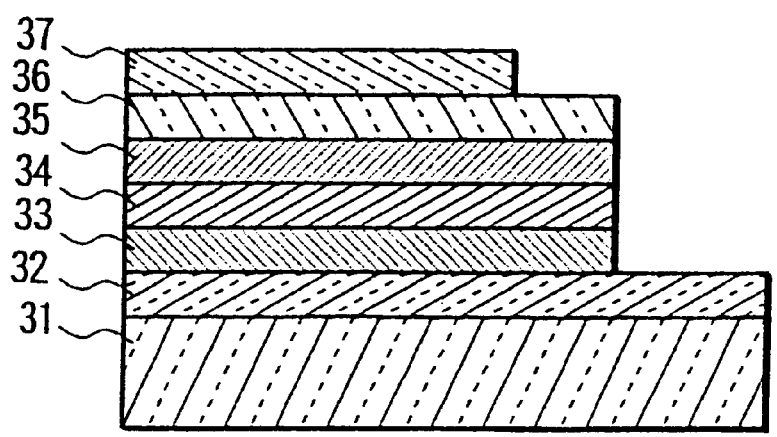
FIG. 7 is a sectional view of a solar cell of CIS system which is constructed by using CdS thin film manufactured according to the method of the present invention.

A Cds thin film was formed according to the method of the present invention and copper-indium-solenide (CIS) solar cell was constructed by using the CdS thin film as an n-type semiconductor layer. FIG. 7 is a sectional view of the solar cell.

A molybdenum electrode 32 was formed on one side surface of a soda lime glass plate 31 by using a conventional evaporation method. Then, a CIS film 33 was formed by a multi-element evaporation method using copper, indium and selenium as source materials, and thus a CdS thin film forming substrate was prepared. A temperature of the thin film forming substrate was controlled to be 350° C. and a CdS thin film 34 was formed on the CIS thin film 33, in the same way as Example 2. Then, a zinc oxide film 35, a transparent electrode of ITO 36, and a magnesium fluoride film 37 were successively formed, and thus the solar cell was constructed.

IV characteristics of the solar cell as per constructed were measured in the same way as in Example 7. Results were as follows; Open circuit voltage was 550 mV, short circuit current density was 39.5 mA/cm$^2$, and photoelectric conversion efficiency under the light source of 100 mW/cm$^2$ was 13.6%. These values prove that the above solar cell has excellent characteristics.

In the above Example, the copper-indium-selenium film was used as a p-type semiconductor layer. It is also possible to use a copper-indium-germanium-selenium film.

COMPARATIVE EXAMPLE 5

A temperature of the surface of the thin film forming substrate was controlled to be 350° C. and a CdS thin film was formed in the same way as in Comparative Example 2. A solar cell was constructed in the same way as in Example 8.

IV characteristics of the solar cell as per constructed were measured in the same way as in Example 7. Results were as follows; Open circuit voltage was 530 mV, short circuit current density was 38.5 mA/cm$^2$ photoelectric conversion efficiency was 12.9%.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method of manufacturing a compound semiconductor thin film comprising the steps of:

pulverizing an organic solvent solution of a metal organic compound containing at least one metal-sulfur bond per molecule into fine particles, wherein the metal is at least one selected from Cd, Zn, Cu, Pb, Hg, heating the obtained fine particles and thus vaporizing said organic solvent, further heating said fine particles and bringing said metal organic compound into a gaseous body, thermally decomposing said gaseous metal organic compound by contacting said gaseous metal organic compound at a heated surface of a thin film forming substrate, and thus forming a compound semiconductor metal sulfide thin film on said thin film forming substrate.

2. The method according to claim 1, wherein said step of pulverizing into fine particles of said organic solvent solution is performed by an ultrasonic vibration of said organic solvent solution.

3. The method according to claim 1, wherein said step of pulverizing into fine particles of said organic solvent solution is performed by a spray injection of said organic solvent solution.

4. The method according to claim 1, wherein an average particle diameter of said fine particles is in a range of 1 to 20 μm.

5. The method according to claim 1, wherein said metal organic compound also contains carbon and nitrogen.

6. The method according to claim 5, wherein said metal organic compound is at least one compound selected from the group consisting of a metal thiocarbamate and a metal dithiocarbamate.

7. The method according to claim 1, wherein said metal organic compound contains at least one cadmium-sulfur bond per one molecule, and a temperature of said heated thin film forming substrate is in a range of 300° C. to 500° C.

8. The method according to claim 1, wherein said organic solvent is at least one solvent selected from the group consisting of 1-methyl-2-pyrrolidone, xylene, toluene, γ-butyrolactone, tetralin, dimethylformamide, dimethylsulfoxide, chloroform, and alcohols.

* * * * *